(12) United States Patent
Shirai

(10) Patent No.: US 6,307,224 B1
(45) Date of Patent: Oct. 23, 2001

(54) DOUBLE DIFFUSED MOSFET

(75) Inventor: Koji Shirai, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/526,471

(22) Filed: Mar. 15, 2000

(30) Foreign Application Priority Data

Mar. 15, 1999 (JP) .............................. P11-069045
Jun. 29, 1999 (JP) .............................. P11-182740

(51) Int. Cl.[7] .................................................. H01L 29/72
(52) U.S. Cl. .................. 257/288; 257/328; 257/335; 257/339; 257/343; 257/408
(58) Field of Search ................................. 257/288, 328, 257/335, 339, 343, 408

(56) References Cited

U.S. PATENT DOCUMENTS 6,150,697 * 11/2000 Teshigahara et al. ............... 257/348

* cited by examiner

*Primary Examiner*—Edward Wojciechowicz
(74) *Attorney, Agent, or Firm*—Oblon, Spivak, McClelland, Maier & Neustadt, P.C.

(57) ABSTRACT

A MOSFET formed on an SOI substrate secures a high withstand voltage and a reduced element area. The SOI substrate includes an insulator layer and an $n^-$-type semiconductor layer formed on the insulator layer. The MOSFET consists of a p-type impurity diffusion region formed on the semiconductor layer, an $n^+$-type source region formed in a surface area in the p-type impurity diffusion region, a gate insulating layer formed on the p-type impurity diffusion region and covering a region between the source region and the semiconductor layer, a gate electrode formed on the gate insulating layer, an $n^+$-type drain region formed on the semiconductor layer at a predetermined position separated from the p-type impurity diffusion region, and an n-type well formed around the drain region. The impurity concentration of the n-type well is lower than that of the drain region and higher than that of the semiconductor layer.

20 Claims, 7 Drawing Sheets

DOUBLE DIFFUSED MOSFET

CROSS-REFERENCE TO RELATED APPLICATIONS

This application is based on Japanese Patent Applications No. 11-69045, filed Mar. 15, 1999 and No. 11-182740, filed Jun. 29, 1999, the entire content of which is incorporated herein by reference.

BACKGROUND OF THE INVENTION

1. Field of the Invention

The present invention relates to a semiconductor device, and particularly, to a planar field effect semiconductor device having a high withstand voltage.

2. Description of the Related Art

FIG. 6A is a sectional view partly showing a MOSFET (metal oxide semiconductor field effect transistor) as a part of a semiconductor power device according to a prior art. This MOSFET is an n-channel planar double diffused MOSFET (DMOSFET) formed on an SOI (semiconductor on insulator) substrate.

The SOI substrate consists of a semiconductor substrate, an insulator layer formed on the semiconductor substrate, and a semiconductor layer (SOI layer) formed on the insulator layer. On the SOI layer, necessary elements are formed. When a device is formed on the SOI substrate, the insulator layer under the SOI layer is advantageous in isolating the elements from one another. Compared with isolation by p-n junctions, isolation by the insulator layer in the SOI substrate is more advantageous because it causes smaller parasitic capacitance or parasitic operation. Due to this, SOI substrates are frequently used for planar MOSFETs.

In FIG. 6A, the conventional SOI substrate on which the n-channel planar MOSFET is formed consists of a p$^-$-type semiconductor substrate 111, an insulator layer 112 formed on the substrate 111, and an n$^{31}$-type SOI layer 113 formed on the insulator layer 112. In a surface area of the SOI layer 113, a p-type impurity diffusion region 114 is formed. In a surface area of the diffusion region 114, and n$^+$-type source region 116 is formed and is electrically connected to a source electrode S. On the diffusion region 114, an oxide film 117 is formed to extend between the source region 116 and the SOI layer 113. On the gate oxide film 117, a gate electrode 118 is formed.

An n$^+$-type drain region 121 is formed in a surface area of the SOI layer 113 and is connected to a drain electrode D. The drain region 121 is separated from the diffusion region 114 by a distance $L_0$. During operation, the surface of the diffusion region 114 under the gate electrode 118 is inverted electrically to form a n-channel.

A p$^+$-type impurity diffusion region 115 may be formed in a surface area of the diffusion region 114. The diffusion region 115 is electrically connected to the source electrode S, to fix the potential of the diffusion region 114 at the potential of the source electrode S. This stabilizes the threshold characteristics of the MOSFET more than electrically floating the diffusion region 114.

FIG. 6B shows depletion layers formed in the SOI layer 113 when the MOSFET is reversely biased. The conventional n-channel MOSFET extends a depletion layer $d_{01}$ around a p-n junction, to relax an electric field and improve the breakdown resistance of the MOSFET. To form depletion layers in the SOI layer 113, the conventional MOSFET decreases an impurity concentration in the SOI layer 113.

On the same substrate where the n-channel MOSFET is formed, a p-channel MOSFET may be formed to provide a CMOS (complementary MOS) structure. FIG. 7A shows such a p-channel planar MOSFET formed on the same substrate where the n-channel MOSFET is present.

Namely, the p-channel MOSFET is formed on the SOI substrate that consists of the p$^-$-type semiconductor substrate 111, the insulator layer 112 formed on the substrate 111, and the n$^-$-type SOI layer 113 formed on the insulator layer 112. In the surface area of the SOI layer 113, there are p$^+$-type source region 124 electrically connected to a source electrode S, an n-type impurity diffusion region 130 serving as a channel region, and a p$^-$-type LDD (lightly doped drain) region 127. The regions 124, 130, and 127 are formed close to one another. On the diffusion region 130, a gate oxide film 125 is formed to extend between the source region 124 and the LDD region 127. On the gate oxide film 125, a gate electrode 126 is formed. In a surface area of the LDD region 127, a p$^+$-type drain region 129 is formed and is connected to a drain electrode D. The drain region 129 is spaced from the diffusion region 130 by a predetermined distance.

An n$^+$-type impurity diffusion region 123 may be formed adjacent to the source region 124 and is electrically connected to the source electrode S. This arrangement fixes the potential of the diffusion region 130 at the potential of the source electrode S through the SOI layer 113, to stabilize the threshold characteristics of the MOSFET.

The p-channel MOSFET of the prior art employs the LDD region 127 to relax an electric field. Namely, the prior art forms an extensive depletion layer at a p-n junction formed around LDD region 127, to relax an electric field and improve the breakdown resistance of the MOSFET. FIG. 7B shows depletion layers formed in the SOI layer 113 when the MOSFET is reversely biased. One depletion layer extends from the source region 124 to the drain region 129 and mainly spreads in the LDD region 127. To extend depletion layers, the prior art decreases an impurity concentration in the LDD region 127 and horizontally elongates the LDD region 127.

As mentioned above, in the n-channel MOSFET of FIG. 6A, it is required to form wider depletion layers in the SOI layer 113 during a reverse bias operation, to improve a withstand voltage. To achieve this and not to limit the depletion layers by the drain region 121, the prior art forms the drain region 121 as far from the diffusion region 114 as possible.

This may improve the withstand voltage of the MOSFET. However, the long distance $L_0$ between the diffusion region 114 and the drain region 121 increases the area of the MOSFET and hinders high integration of elements in the semiconductor device. In addition, the long distance $L_0$ increases electric resistance in the SOI layer 113, to increase the ON-resistance of the MOSFET.

To minimize the area of the MOSFET, the drain region 121 must be brought close to the edges of depletion layers. The drain region 121 has a high impurity concentration to secure an ohmic contact to the drain electrode D, and therefore, it suddenly stops depletion layers like a depletion layer $d_{03}$ in FIG. 6B and generates impact ions that may break down the MOSFET. To avoid such a breakdown and absorb process variations, a sufficient margin must be included in the distance between depletion layers and the drain region 121. This increases the area and ON-resistance of the MOSFET.

Like the n-channel MOSFET, in the case of the p-channel MOSFET of FIG. 7A, it is required to form depletion layers during a reverse bias operation, to improve a withstand voltage. To achieve this, the LDD region 127 must be long.

Namely, the drain region 129 must be distanced away from the source region 124. This increases the area of the MOSFET and hinders high integration of elements. Elongating the LDD region 127 increases electric resistance to increase the ON-resistance of the MOSFET.

In the p-channel MOSFET, when a depletion layer reaches the drain region 129, the depletion layer is suddenly stopped by the drain region 129 due to a sudden change in impurity concentration, to generate impact ions that may break down the MOSFET. To avoid this and to absorb process variations, the distance between depletion layers and the drain region 129 must have a sufficient margin. This results in elongating the LDD region 127, thereby increasing the area and ON-resistance of the MOSFET.

In this way, any of n- and p-channel MOSFETs of the prior art realizes a high withstand voltage only by increasing the area and ON-resistance thereof.

SUMMARY OF THE INVENTION

An object of the present invention is to provide a semiconductor device capable of securing reduced dimensions and a high withstand voltage.

Another object of the present invention is to provide a semiconductor device capable of securing a stabilized high withstand voltage and a low ON-resistance value.

In order to accomplish the objects, a first aspect of the present invention provides a semiconductor device having a semiconductor layer of a first conductivity type formed on an insulator layer, a first impurity diffusion region of a second conductivity type formed in a surface area of the semiconductor layer, a second impurity diffusion region of the first conductivity type formed in a surface area of the first impurity diffusion region and serving as a source region, a gate insulating layer formed on a first impurity diffusion region and covering a region between the source region and the semiconductor layer, a gate electrode formed on the gate insulating layer, a third impurity diffusion region of the first conductivity type formed in a surface area of the semiconductor layer at a predetermined position away from the first impurity diffusion region, and a fourth impurity diffusion region of the first conductivity type formed in a surface area of the third impurity diffusion region and serving as a drain region. The impurity concentration of the third impurity diffusion region is lower than that of the drain region and higher than that of the semiconductor layer.

When the semiconductor device of the first aspect is reversely biased, an upper depletion layer formed in the semiconductor layer is restricted by the third impurity diffusion region and hardly reaches the drain region of high impurity concentration. As a result, no impact ions are formed, and therefore, no breakdown due to impact ions occurs. The semiconductor device secures a high withstand voltage due to a lower depletion layer that extends along a lower part of the semiconductor layer. Consequently, the semiconductor device secures a high withstand voltage and reduced dimensions.

A second aspect of the present invention provides a semiconductor device having a semiconductor layer of a first conductivity type formed on an insulator layer, a first impurity diffusion region of a second conductivity type formed in a surface area of the semiconductor layer, a second impurity diffusion region of the first conductivity type formed in a surface area of the first impurity diffusion region and serving as a source region, a third impurity diffusion region of the first conductivity type formed in a surface area of the semiconductor layer so that an edge thereof is in contact with the first impurity diffusion region, a gate insulating layer formed on the first impurity diffusion region and covering a region between the source region and the third impurity diffusion region, a gate electrode formed on the gate insulating layer, and a fourth impurity diffusion region of the first conductivity type formed in a surface area of the third impurity diffusion region and serving as a drain region. The impurity concentration of the third impurity diffusion region is lower than that of the drain region and higher than that of the semiconductor layer. The impurity concentration of the third impurity diffusion region increases from the first impurity diffusion region side toward the drain region side.

According to the second aspect, the impurity concentration of the third impurity diffusion region is low on the first impurity diffusion region side and high on the drain region side. When the semiconductor device is reversely biased, an upper depletion layer is restricted by the third impurity diffusion region and hardly reaches the drain region of high impurity concentration. As a result, no impact ions are generated, and therefore, no breakdown due to impact ions occurs. A withstand voltage of the semiconductor device is secured by a lower depletion layer that extends along a lower part of the semiconductor layer. Since the third impurity diffusion region is in contact with the first impurity diffusion region, the semiconductor device is operable without passing a drain current through the semiconductor layer of low impurity concentration. Namely, the semiconductor layer applies no large resistance on an output current. As a result, the semiconductor device secures a high withstand voltage and reduced dimensions.

A third aspect of the present invention provides a semiconductor device having a semiconductor layer of a first conductivity type formed on an insulator layer, a first impurity diffusion region of the first conductivity type formed in a surface area of the semiconductor layer, a second impurity diffusion region of a second conductivity type formed in a surface area of the first impurity diffusion region and serving as a source region, a third impurity diffusion region of the second conductivity type formed in a surface area of the semiconductor layer so that an edge thereof is in contact with the first impurity diffusion region, a gate insulating layer formed on the first impurity diffusion region and covering a region between the source region and the third impurity diffusion region, a gate electrode formed on the gate insulating layer, and a fourth impurity diffusion region of the second conductivity type formed in a surface area of the third impurity diffusion region and serving as a drain region. The depth of the third impurity diffusion region is smaller than the thickness of the semiconductor layer and is set so that, when the semiconductor device is reversely biased, a depletion layer extending from a lower part of the gate electrode to the third impurity diffusion region joins a depletion layer extending around an interface of the insulator layer.

When the semiconductor device of the third aspect is reversely biased, a depletion layer extends from the channel region to the third impurity diffusion region, and another depletion layer extends around the insulator layer. These depletion layers join to provide a wide depletion-layer bottom to secure a high withstand voltage. During operation, a drain current flows through the whole of the third impurity diffusion region that is thick, to decrease ON-resistance.

A fourth aspect of the present invention provides a semiconductor device having a semiconductor layer of a first conductivity type formed on an insulator layer, a first impurity diffusion region of the first conductivity type formed in a surface area of the semiconductor layer, a second impurity diffusion region of a second conductivity type formed in a surface area of the first impurity diffusion region and serving as a source region, a third impurity diffusion region of the second conductivity type formed in a surface area of the semiconductor layer so that an edge thereof is in contact with the first impurity diffusion region, a gate insulating layer formed on the first impurity diffusion region and covering a region between the source region and the third impurity diffusion region, a gate electrode formed on the gate insulating layer, and a fourth impurity diffusion region of the second conductivity type formed in a surface area of the third impurity diffusion region and serving as a drain region. The depth of the third impurity diffusion region is in the range of about ⅓ to ⅔ of the thickness of the semiconductor layer.

According to the fourth aspect, the depth of the third impurity diffusion region is about ⅓ to ⅔ of the thickness of the semiconductor layer. When the semiconductor device is reversely biased, a depletion layer extending from a channel region to the third impurity diffusion region joins a depletion layer formed around the insulator layer to provide a large depletion-layer bottom that secures a high withstand voltage. During operation, a drain current flows through the whole of the third impurity diffusion region that is thick, to reduce ON-resistance.

DESCRIPTION OF THE PREFERRED EMBODIMENTS (First embodiment)

Figure 1A:
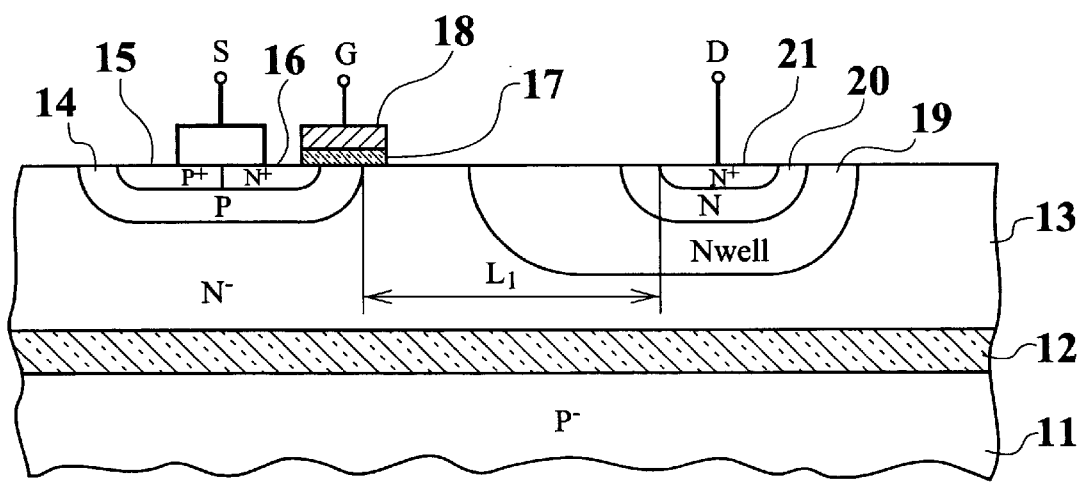
FIGS. 1A and 1B are sectional views showing an n-channel MOSFET and depletion layers formed therein according to a first embodiment of the present invention.

FIG. 1A is a sectional view showing an n-channel MOSFET formed on an SOI substrate according to the first embodiment of the present invention. This MOSFET is characterized by an n-type impurity diffusion region 20 and an n- type well 19 (N-well) formed around an n$^+$-type drain region 21. The impurity concentrations of the diffusion region 20 and N-well 19 are higher than the impurity concentration of the n$^-$-type SOI layer 13 and lower than the impurity concentration of the drain region 21. Compared with the prior art, the distance L$_1$ between the drain region 21 and a p-type impurity diffusion region 14 is drastically short, to reduce the size of the MOSFET.

The MOSFET of the first embodiment will be explained in detail with reference to the drawings. In this embodiment, the MOSFET has a designed withstand voltage of 200 V.

A p$^-$-type semiconductor substrate 11 is made of, for example, p$^-$-type silicon. On the substrate 11, an SiO$_2$ insulator layer 12 of about 1 μm thick is formed. On the insulator layer 12, the n$^-$-type SOI layer (semiconductor layer) 13 of about 10 μm thick and 10$^{14}$ cm$^{-3}$ in impurity concentration is formed. The layers 11 to 13 form an SOI substrate.

In a predetermine surface area of the SOI layer 13, a p-type impurity diffusion region 14 (first impurity diffusion region) of about 10$^{17}$ cm$^{-3}$ in impurity concentration and an n$^+$-type impurity diffusion region 16 (second impurity diffusion region) of about 10$^{20}$ cm$^{-3}$ in impurity concentration are formed by double diffusion. The diffusion region 16 serves as a source region and is electrically connected to a source electrode S. On the diffusion region 14, a thin gate oxide film 17 of about 10 nm to 100 nm is formed to extend between the source region 16 and the SOI layer 13. On the gate oxide film 17, a polysilicon gate electrode is formed. During operation, an n-type channel is formed at the surface of the diffusion region 14 under the gate electrode 18.

To stabilize the ON characteristics of the MOSFET, a p$^+$-type impurity diffusion region 15 is formed in the surface area of the diffusion region 14 and is short-circuited to the source electrode S. This fixes the potential of the impurity region 14 at the potential of the source electrode S.

Away from an end of the diffusion region 14, i.e., a channel end by the distance L$_1$, there is the drain region 21 (fourth impurity diffusion region). The drain region 21 is surrounded by the diffusion region 20 (second well) and the N-well 19 (first well). The impurity concentrations of the diffusion region 20 and N-well 19 (third impurity diffusion region) are in the range of 10$^{14}$ cm$^{-3}$ to 10$^{19}$ cm$^{-3}$ and are higher than the impurity concentration of the SOI layer 13 and lower than the impurity concentration of the drain region 21. For example, the impurity concentration of the drain region 21 is 10$^{19}$ cm$^{-3}$ to 10$^{20}$ cm$^{-3}$, that of the diffusion region 20 about 10$^{17}$ cm$^{-3}$, and that of the N-well 19 about 10$^{10}$ cm$^{-3}$.

Figure 1B:
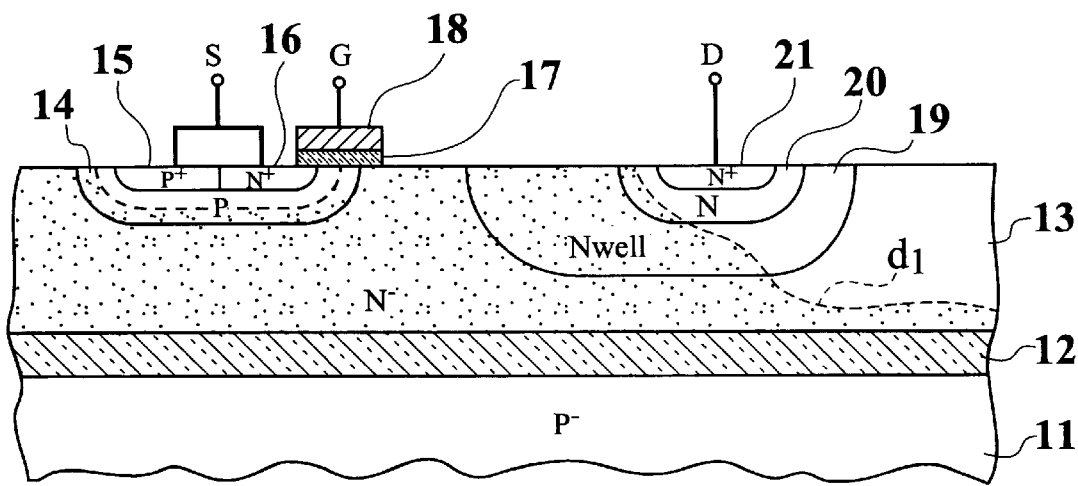
Figure 6A:
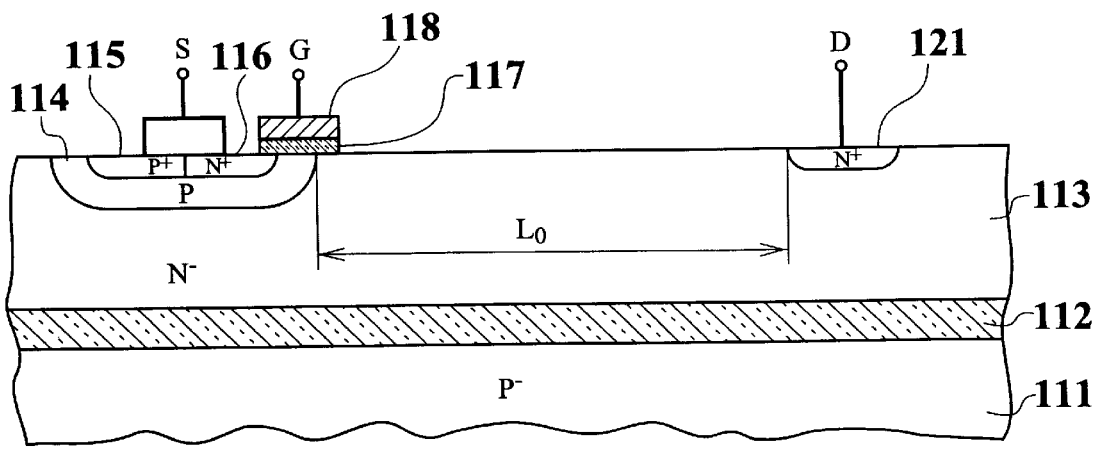
FIGS. 6A and 6B are sectional views showing an n-channel MOSFET and depletion layers formed therein according to a prior art.
Figure 6B:
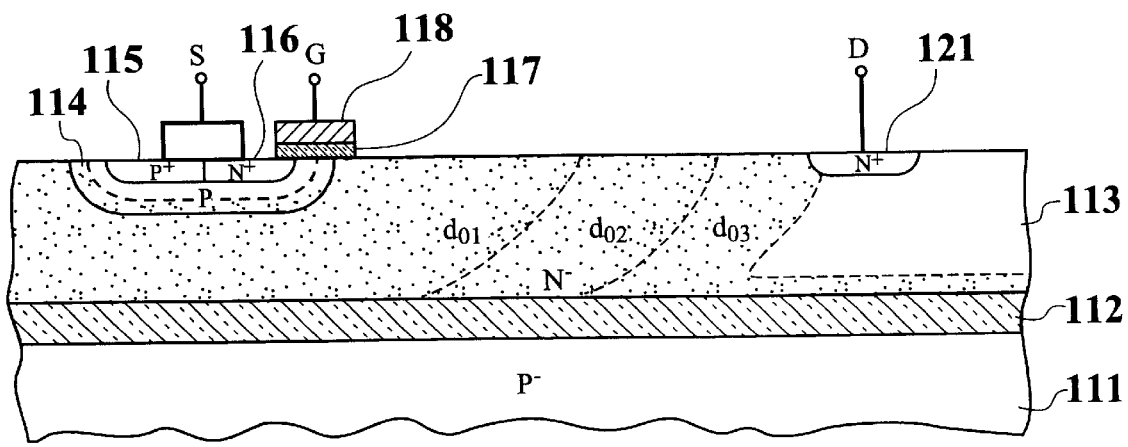

FIG. 1B shows depletion layers formed in the MOSFET of FIG. 1A when the MOSFET is reversely biased. According to the prior art of FIG. 6B, depletion layers extend in proportion to a decrease in the impurity concentration of the SOI layer 113 and show boundaries d$_{01}$ to d$_{03}$ of cup shapes corresponding to the shape of a p-n junction between the diffusion region 114 and the SOI layer 113. On the other hand, the MOSFET of the first embodiment forms a depletion layer whose upper part is restricted by the diffusion region 20 and whose lower part extends through the N-well 19 to join a depletion layer formed around the insulator layer 12.

Although the distance L$_1$ between the drain region 21 and the diffusion region 14 is short, the diffusion region 20 around the drain region 21 prevents the depletion layer d$_1$ from directly contacting the drain region 21. In addition, the diffusion region 20 relaxes a sudden change in impurity concentration, to thereby prevent impact ions. Since no impact ions are generated, the MOSFET causes no breakdown, secures stable operation, and achieves a high withstand voltage due to the depletion layer d$_1$ extending along a lower part of the SOI layer 13.

Unlike the prior art that must maintain a distance of about 30 μm as the distance L$_0$ between the diffusion region 114 and the drain region 121 to obtain a withstand voltage of 200 V, the first embodiment needs only about 15 μm between the diffusion region 14 and the drain region 21. Namely, the first embodiment halves the distance to achieve a withstand voltage of 200 V and reduces an element area by 30% or more compared with the prior art.

When the thickness of the SOI layer 13 is about 10 μm and that of the diffusion region 14 is 2 μm to 3 μm, the depletion layer extending from the diffusion region 14 is integrated with the depletion layer formed around the insulator layer 12. If the depth of the diffusion region 14 is too shallow with respect to the thickness of the SOI layer 13, the depletion layer extending from the diffusion region 14 may not combine with the depletion layer formed around the insulator layer 12. To avoid this, the depth of the diffusion region 14 must properly be set.

In FIG. 1A, impurity concentrations around the drain region 21 gradually decrease through the diffusion region 20 and N-well 19. To surely prevent impact ions, the impurity concentrations around the drain region 21 may be more gradually changed continuously or step by step.

Figure 2:
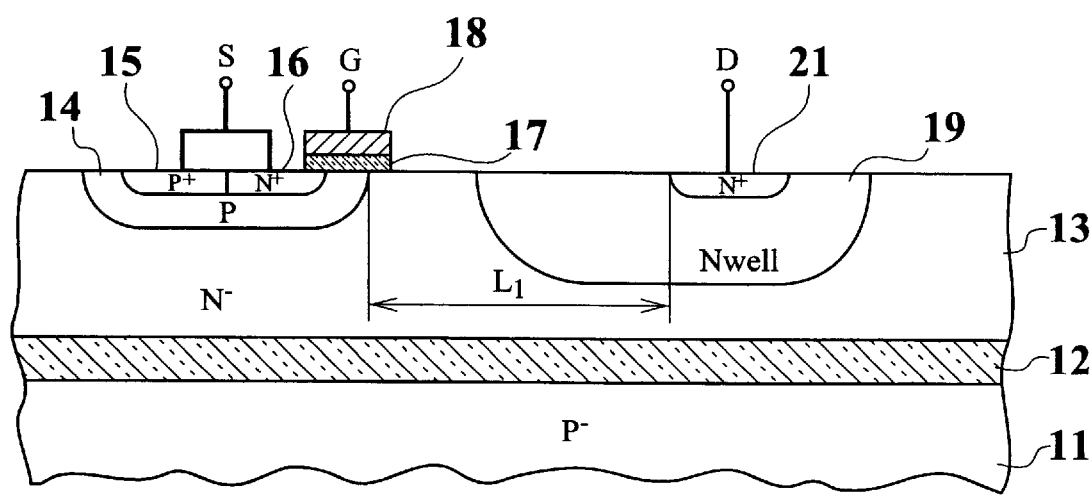
FIG. 2 is a sectional view showing another n-channel MOSFET according to the first embodiment.

FIG. 2 is a sectional view showing another n-channel MOSFET according to the first embodiment. This MOSFET has only an N-well 19 around an n$^+$-type drain region 21. The impurity concentration of the N-well 19 is higher than that of an n$^-$-type SOI layer 13 and lower than that of the drain region 21. For example, the impurity concentration of the N-well 19 is in the range of $10^{14}$ cm$^{-3}$ to $10^{19}$ cm$^{-3}$. In this case, the distance $L_1$ between a p-type impurity diffusion region 14 and the drain region 21 to secure a withstand voltage of 200 V is about 20 μm.

The MOSFETs of the first embodiment are manufacturable according to standard MOSFET processes. These processes will be explained.

The surface of a p-type silicon monocrystalline substrate (p$^-$-type semiconductor substrate) 11 is thermally oxidized, to form an SiO$_2$ layer of about 1 μm thick serving as an insulator layer 12. On the insulator layer 12, and n$^-$-type SOI layer 13 is formed by doping phosphorus (P) of about $10^{14}$ cm$^{-3}$ into silicon by low-pressure CVD (LP-CVD). This completes an SOI substrate. The SOI substrate may be prepared by wafer bonding that bonds two wafers each having an oxidized face to each other and thins the face of one of the wafers, or by SIMOX (separation by implanted oxygen) that implants oxygen ions into an wafer to form an insulator layer.

The surface of the SOI layer 13 is thermally oxidized, to form a field oxide film. The field oxide film is patterned. The patterned film is used as a mask to implant ions, and annealing is carried out to form an N-well 19.

The field oxide film is removed by etching, to again expose the surface of the SOI layer 13. The surface of the SOI layer 13 is thermally oxidized to form a gate oxide film 17 of about 10 nm to 100 nm thick.

On the gate oxide film 17, a phosphorus-doped polysilicon film of about 500 μm thick is formed by LP-CVD. The polysilicon film is patterned by photolithography into a gate electrode 18.

Over the gate electrode 18 and SOI layer 13, a resist film is formed and patterned. The patterned resist film and the gate electrode 18 are used as masks to implant p-type impurity ions such as boron ions into the SOI layer 13 under predetermined conditions. A patterned resist mask is prepared to implant n-type impurity ions into the N-well 19. Annealing is carried out to form a p-type impurity diffusion region 14 and an n-type impurity diffusion region 20 each having a depth of about 2 μm to 3 μm.

A resist pattern is prepared, and the resist pattern and gate electrode 18 are used as masks to implant n-type impurity ions such as phosphorus ions. Annealing is carried out to simultaneously from an n$^+$-type source region 16 having a depth of about 0.2 μm to 0.3 μm in the diffusion region 14 and an n$^+$-type drain region 21 in the diffusion region 20. At this time, a p$^+$-type impurity diffusion region 15 may be formed by annealing if p-type impurity ions such as boron ions have been implanted in the diffusion region 14 in advance.

Through these processes, the MOSFET of the first embodiment of FIG. 1A is produced. Generally, several hundreds to several thousands of MOSFETs having a rated current are formed on a single chip. To form a CMOS structure on the same substrate, the N-well 19, diffusion region 20, etc., are formed when forming p-channel MOSFETs. Accordingly, the manufacturing of the MOSFETs of the first embodiment brings little additional load on usual manufacturing processes.

(Second embodiment)

Figure 3A:
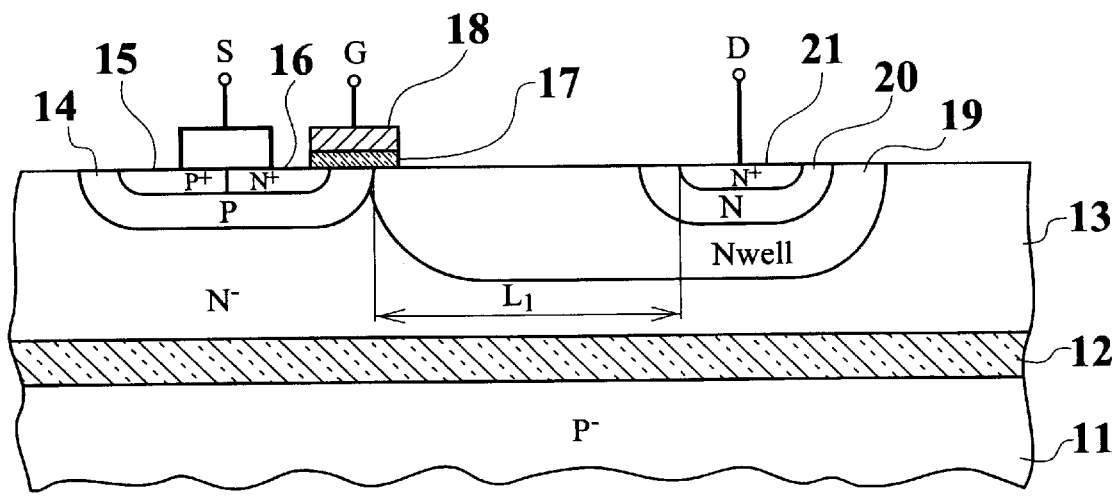
FIGS. 3A and 3B are sectional views showing an n-channel MOSFET and depletion layers formed therein according to a second embodiment of the present invention.

FIG. 3A is a sectional view showing an n-channel MOSFET formed on an SOI substrate according to the second embodiment of the present invention. This MOSFET is characterized by an n-type impurity diffusion region 20 and an N-well 19 formed around an n$^{30}$-type drain region 21. The impurity concentrations of the diffusion region 20 and N-well 19 are higher than the impurity concentration of an n$^-$-type SOI layer 13 and lower than the impurity concentration of the drain region 21. An edge of the N-well 19 is in contact with a p-type impurity diffusion region 14. This structure greatly shortens a distance $L_1$ between the drain region 21 and the diffusion region 14, thereby reducing the size and ON-resistance of the MOSFET.

The MOSFET of the second embodiment will be explained in detail with reference to the drawings. In this embodiment, the MOSFET has a designed withstand voltage of 200 V.

A p$^-$-type semiconductor substrate 11 is made of silicon. On the substrate 11, an SiO$_2$ insulator layer 12 of about 1 μm thick is formed. On the insulator layer 12, the n$^-$-type silicon SOI layer 13 of about 10 μm thick and $10^{14}$ cm$^{-3}$ in impurity concentration is formed. The layers 11 to 13 form an SOI substrate. In a predetermined surface area of the SOI layer 13, the p-type impurity diffusion region 14 of about $10^{17}$ cm$^{-3}$ in impurity concentration and an n$^+$-type source region 16 of about $10^{19}$ cm$^{-3}$ in impurity concentration are formed by double diffusion. The source region 16 is electrically connected to a source electrode S and is surrounded by the diffusion region 14.

Away from an end of the diffusion region 14, i.e., a channel end by the distance $L_1$, there is the drain region 21. The drain region 21 is surrounded by the diffusion region 20 and N-well 19. Unlike the first embodiment of FIG. 1A, an edge of the N-well 19 is in contact with the diffusion region 14.

The impurity concentrations of the diffusion region 20 and N-well 19 are se to be higher than that of the SOI layer 13 and lower than that of the drain regions 21. For example, the impurity concentration of the drain region 21 is $10^{19}$ cm$^{-3}$ to $10^{20}$ cm$^{-3}$, that of the diffusion region 20 about $10^{17}$ cm$^{-3}$, and that of the N-well 19 about $10^{10}$ cm$^{-3}$.

On the diffusion region 14, a thin gate oxide film 17 of about 10 nm to 100 nm is formed to extend between the source region 16 and the N-well 19. On the gate oxide film 17, a gate electrode 18 made of polysilicon is formed. During operation, an n-type channel is formed at the surface of the diffusion region 14 under the gate electrode 18.

To stabilize the ON characteristics of the MOSFET, a p$^+$-type impurity diffusion region 15 may be formed in the surface area of the diffusion region 14 and is short-circuited to the source electrode S like the first embodiment. This fixes the potential of the impurity region 14 at the potential of the source electrode S.

Figure 3B:
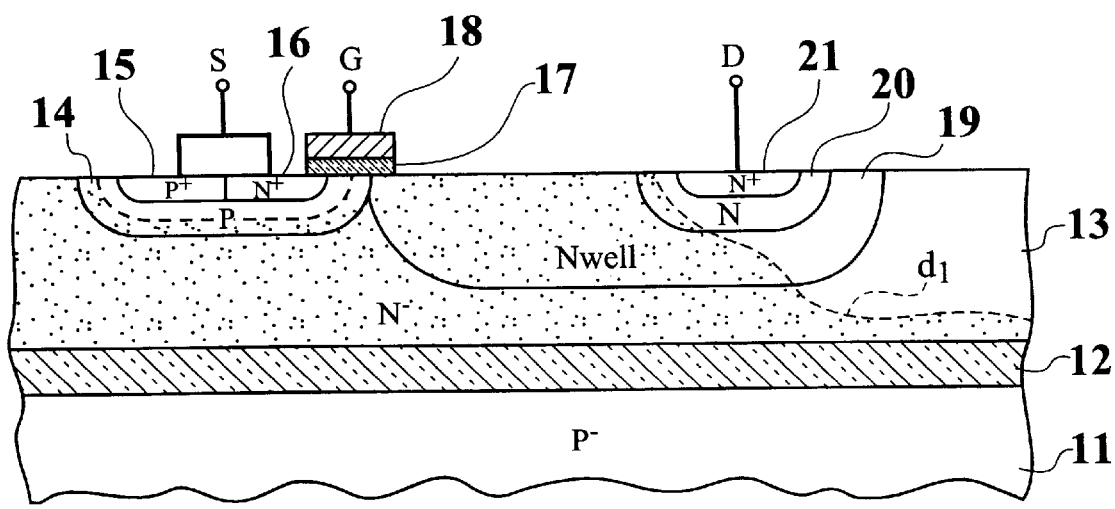

FIG. 3B is a sectional view showing depletion layers formed in the MOSFET of the second embodiment when the MOSFET is reversely biased. A depletion layer extending from the diffusion region 14 has an upper part restricted by the diffusion region 20 and a lower part extending through the N-well 19 to the insulator layer 12 and joining a depletion layer formed around the insulator layer 12.

Although the distance $L_1$ between the drain region 21 and the diffusion region 14 is short, the diffusion region 20 and N-well 19 around the drain region 21 prevent the depletion layer $d_1$ from directly contacting the drain region 21 because the diffusion region 20 and N-well 19 change impurity concentrations step by step. This structure prevents the generation of impact ions. Since there are breakdown caused by the impact ion generation, the MOSFET secures stable operation, and achieves a high withstand voltage due to the depletion layer $d_1$ extending along a lower part of the SOI layer 13.

Unlike the prior art that must maintain about 30 μm as the distance $L_0$ between the diffusion region 114 and the drain region 121 to obtain a withstand voltage of 200 V, the second embodiment needs only about 10 μm as the distance $L_1$ between the diffusion region 14 and the drain region 21.

According to the second embodiment, a drain current during operation mainly flows through the N-well 19 and diffusion region 20. Compared with the prior art that passes a drain current through the SOI layer 113, the second embodiment reduces parasitic resistance due to the drain current, thereby decreasing ON-resistance. More precisely, the ON-resistance of the second embodiment is about ½ of that of the prior art, to provide the same withstand voltage. Namely, the second embodiment is capable of halving the element area of the prior art, to provide the same output current. The second embodiment needs about ⅔ of the element area of the first embodiment, to provide the same output current.

The MOSFET of the second embodiment is manufacturable like the MOSFET of the first embodiment. When a CMOS structure is formed on the same substrate, the N-well 19 and diffusion region 20 may be formed during the preparation of p-channel MOSFETs, to simplify manufacturing processes.

(Third embodiment)

Figure 4A:
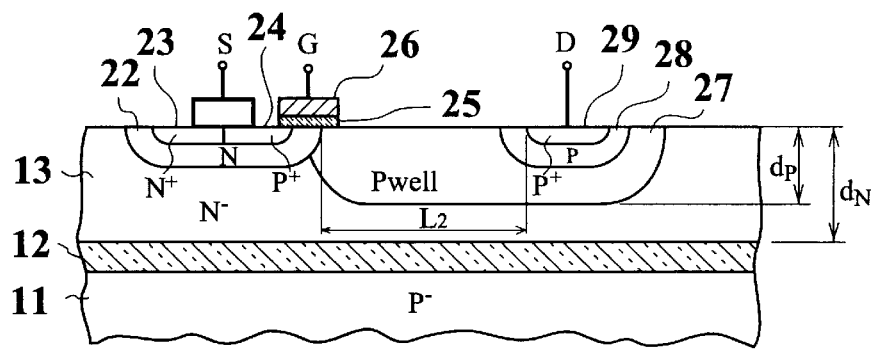
FIG. 4A is a sectional view showing a p-channel MOSFET according to a third embodiment of the present invention.

FIG. 4A is a sectional view showing a p-channel MOSFET formed on an SOI substrate according to the third embodiment of the present invention. Unlike the p-channel MOSFET of the prior art shown in FIG. 7A, the MOSFET of the third embodiment has a double diffusion structure of source and channel regions. An n-type impurity diffusion region 22 serving as the channel region is adjacent to a P-well 27. In the surface area of the P-well 27, a p$^+$-type drain region 29 is formed. The P-well 27 has a proper depth away from an insulator layer 12. This MOSFET secures a high withstand voltage with a short distance $L_2$ between the diffusion region 22 and the drain region 29.

The p-channel MOSFET of the third embodiment will be explained in detail with reference to the drawings. In this embodiment, the MOSFET has a designed withstand voltage of about 200 V.

The MOSFET is formed on an SOI substrate. The SOI substrate has a p$^-$-type silicon substrate 11, the insulator layer 12 of SiO$_2$ of about 1 μm thick formed on the substrate 11, and an n$^-$-type silicon SOI layer 13 (semiconductor layer) of about 10 μm thick and $10^{14}$ cm$^{-3}$ in impurity concentration.

In a predetermined surface area of the SOI layer 13, a p$^+$-type source region (second impurity diffusion region) 24 of about $10^{19}$ cm$^{-3}$ in impurity concentration is formed and is electrically connected to a source electrode S. Around the source region 24, the n-type impurity diffusion region (first impurity diffusion region) 22 of about $10^{17}$ cm$^{-3}$ in impurity concentration is formed. These diffusion regions 24 and 22 are formed by double diffusion in a self-aligning manner with the use a gate electrode 26 as a mask. There is no such a structure in the conventional p-channel MOSFET of FIG. 7A.

Away from an end of the diffusion region 22, i.e., an end of the channel region by a distance $L_2$, the p$^+$-type drain region (fourth impurity diffusion region) 29 is formed. Around the drain region 29, a p-type impurity diffusion region 28 and the P-well 27 (third impurity diffusion region) are formed. The impurity concentration of the diffusion region 28 is lower than that of the drain region 29 and higher than that of the p-type well 27(P-well).

For example, the drain region 29 has an impurity concentration of about $10^{19}$ cm$^{-3}$ to $10^{20}$ cm$^{-3}$. In this case, the diffusion region 28 may have an impurity concentration of about $10^{17}$ cm$^{-3}$, and the P-well 27 may have an impurity concentration of about $10^{16}$ cm$^{-3}$. An end of the P-well 27 is in contact with the diffusion region 22. The P-well 27 has a depth of $d_p$, which will be explained later.

A thin gate oxide film 25 of about 10 nm to 100 nm thick is formed on the diffusion region 22 and extends between the source region 24 and the P-well 27. The gate electrode 26 made of polysilicon is formed on the gate oxide film 25. During operation, a p-type channel is formed at the surface of the diffusion region 22 under the gate electrode 26.

An n$^+$-type impurity diffusion region 23 may be formed in the surface area of the diffusion region 22 and may be short-circuited to the source electrode S. This arrangement fixes the potential of the diffusion region 22 at the potential of the source electrode S, to stabilize the threshold characteristics of the MOSFET.

Figure 4B:
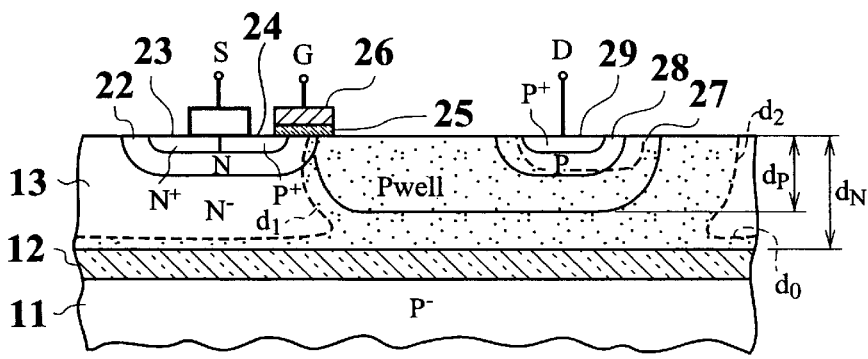
FIGS. 4B to 4D are sectional views showing the p-channel MOSFET of the third embodiment with various well depths and depletion layers.

FIG. 4B shows depletion layers formed in the MOSFET of the third embodiment when the MOSFET is reversely biased.

Figure 4C:
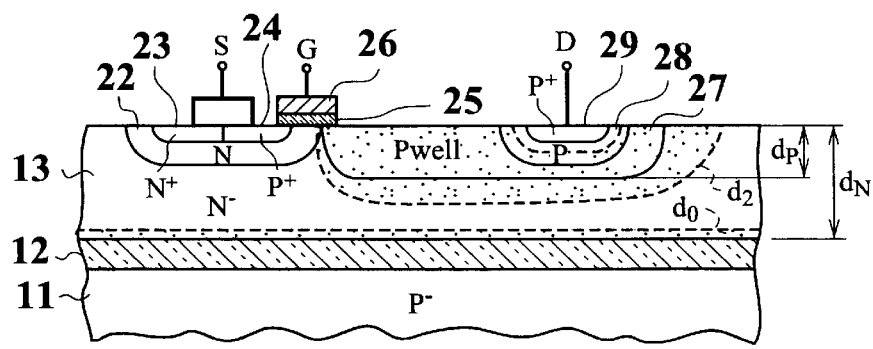

FIG. 4C shows the same with the P-well 27 having a depth of $d_p$ that is shallower than ⅓ of a thickness of $d_N$ of the SOI layer 13. In this case, a depletion layer extending around the P-well 27 is separated from a depletion layer formed around the insulator layer 12.

As shown in FIGS. 4B and 4C, one depletion layer extends from the channel region to the inside and outside of the P-well 27. The P-well 27 is sufficiently thicker than the drain region 29. Although the depletion layer spreads beyond the drain region 29, it is blocked by the P-well 27 and diffusion region 28 from reaching the drain region 29. As a result, no impact ions are generated, and therefore, the MOSFET causes no breakdown.

In FIG. 4B, the depth $d_p$ of the P-well 27 is adjusted so that the depletion layer $d_2$ extending from the channel region may be integrated with a depletion layer $d_0$ formed around the insulator layer 12. For example, the depth $d_p$ of the P-well 27 is adjusted to about ⅓ to ⅔ of the thickness $d_N$ of the SOI layer 13. If the thickness $d_N$ of the SOI layer 13 is 10 μm, the depth $d_p$ of the P-well 27 may be about 3 μm to 7 μm, preferably, 5 μm.

Adjusting the depth of the P-well 27 results in combining the depletion layer $d_2$ extending from the source region 24 with the depletion layer $d_0$ formed around the insulator layer 12, to form a large integrated depletion layer $d_1$ having a wide bottom. This greatly improves the withstand voltage of the MOSFET without elongating the distance $L_2$ between the channel end and the drain region 29.

Figure 7A:
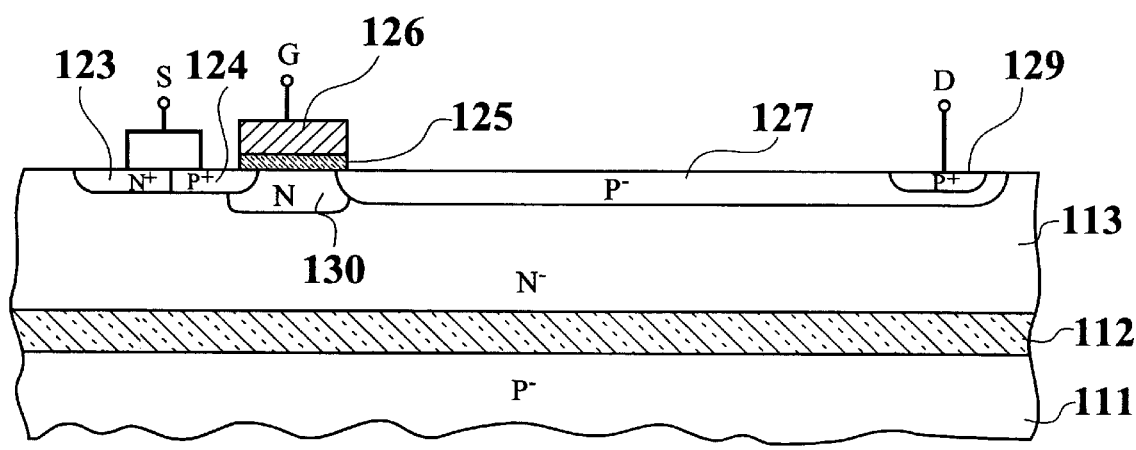
FIGS. 7A and 7B are sectional views showing a p-channel MOSFET and depletion layers formed therein according to a prior art.
Figure 7B:
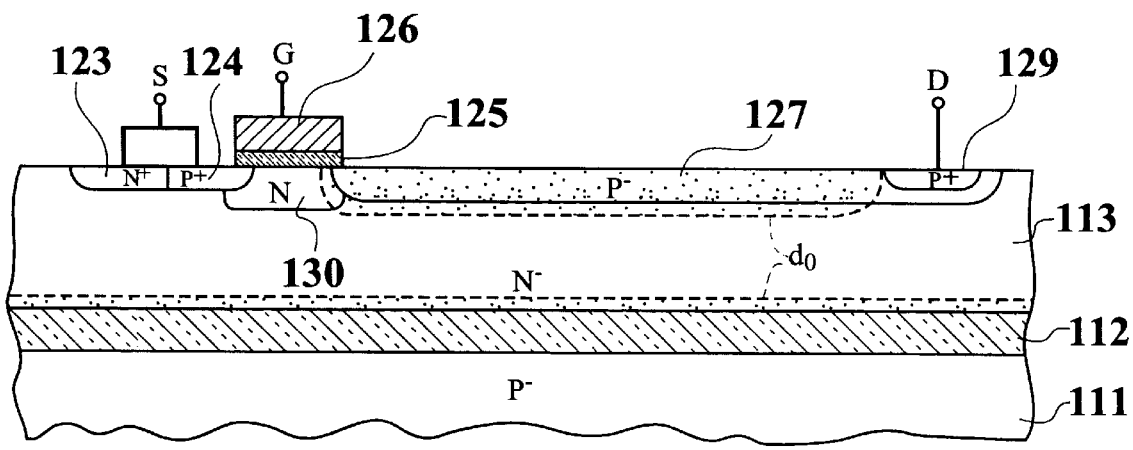

To realize a withstand voltage of 200 V, the prior art of FIG. 7A must have a distance of about 20 µm between the channel end and the drain region. This distance can be halved by the third embodiment of FIG. 4B to about 10 µm. In other words, the third embodiment can increase the withstand voltage of a MOSFET 70% higher than the prior art with the same source-drain distance.

When activated, the MOSFET of the third embodiment passes a drain current through the whole of the P-well 27, thereby reducing the parasitic resistance of the drain electrode and the ON resistance of the MOSFET. On the other hand, the prior art passes a drain current through the p$^-$-type LDD region 127 to increase parasitic resistance and ON resistance.

Figure 4D:
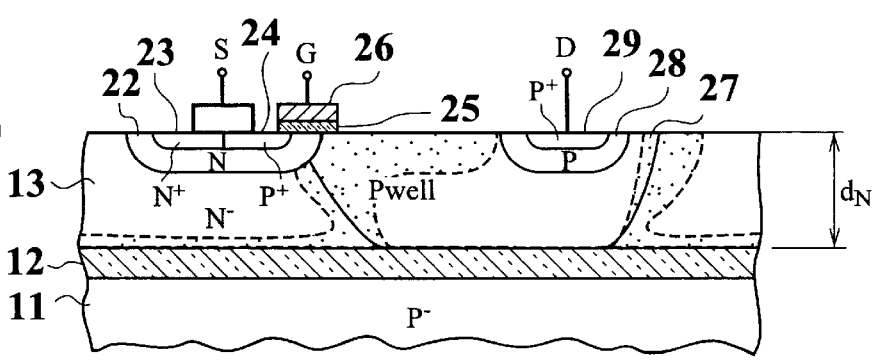

The diffusion region 28 around the drain region 29 may be omitted, and only the P-well 27 may be formed around the drain region 29, if the depth of the P-well 27 is set as mentioned above so that the depletion layer $d_2$ formed around the P-well 27 may join the depletion layer $d_0$ formed around the insulator layer 12. In FIG. 4D, the P-well 27 is deep to reach the insulator layer 12. In this case, the depletion layers disappear around a contact between the P-well 27 and the insulator layer 12, to decrease the withstand voltage of the MOSFET.

When the depth of the P-well 27 is thicker than ⅔ of the thickness $d_N$ of the SOI layer 13, a part of the depletion layer may be disappeared even if the P-well 27 does not reach to the insulation layer 12.

The MOSFET of the third embodiment is manufacturable like the MOSFET of the first embodiment. A method of manufacturing the MOSFET of the third embodiment will briefly be explained. The same steps as those of the first embodiment will not be explained again.

An SOI substrate is prepared like the first embodiment. The surface of an n$^-$-type SOI layer 13 is thermally oxidized to form a field oxide film. The field oxide film is patterned to form a mask, which is used to implant ions. Annealing is carried out to form a P-well 27. The field oxide film is removed by etching, to again expose the surface of the SOI layer 13.

The surface of the SOI layer 13 is thermally oxidized, to form a gate oxide film 25 of 10 nm to 100 nm thick.

On the gate oxide film 25, a phosphorus-doped polysilicon film of 500 nm thick is formed by LD-CVD. The polysilicon film is pattered by photolithography into a gate electrode 26.

A resist film is formed over the gate electrode 26 and SOI layer 13 and is patterned. The patterned resist and gate electrode 26 are used as masks to implant impurity ions such as n-type phosphorus ions into the SOI layer 13. At the same time, a resist pattern mask is used to implant ions to form a P-well 27. Annealing is carried out to form an n-type impurity diffusion region 22 and a p-type impurity diffusion region 28 each having a depth of about 2 µm to 3 µm.

Another resist pattern is formed and is used with the gate electrode 26 as a mask to implant p-type impurity ions such as boron ions. At the same time, p-type impurity ions are implanted into a region where a drain region is formed. Annealing is carried out to form a p$^+$-type source region 24 in the diffusion region 22, and a p$^+$-type drain region 29 in the diffusion region 28. The regions 24 and 29 have each a depth of about 0.2 µm to 0.3 µm. At this time, n-type impurity ions such as phosphorus ions may be implanted in a region in the diffusion region 22 adjacent to the source region 24, to form an n$^+$-type impurity diffusion region 23 by annealing.

Through these processes, the MOSFET of the third embodiment is produced. These processes are substantially the same as those of the first embodiment except implanted ion seeds.

Figure 5:
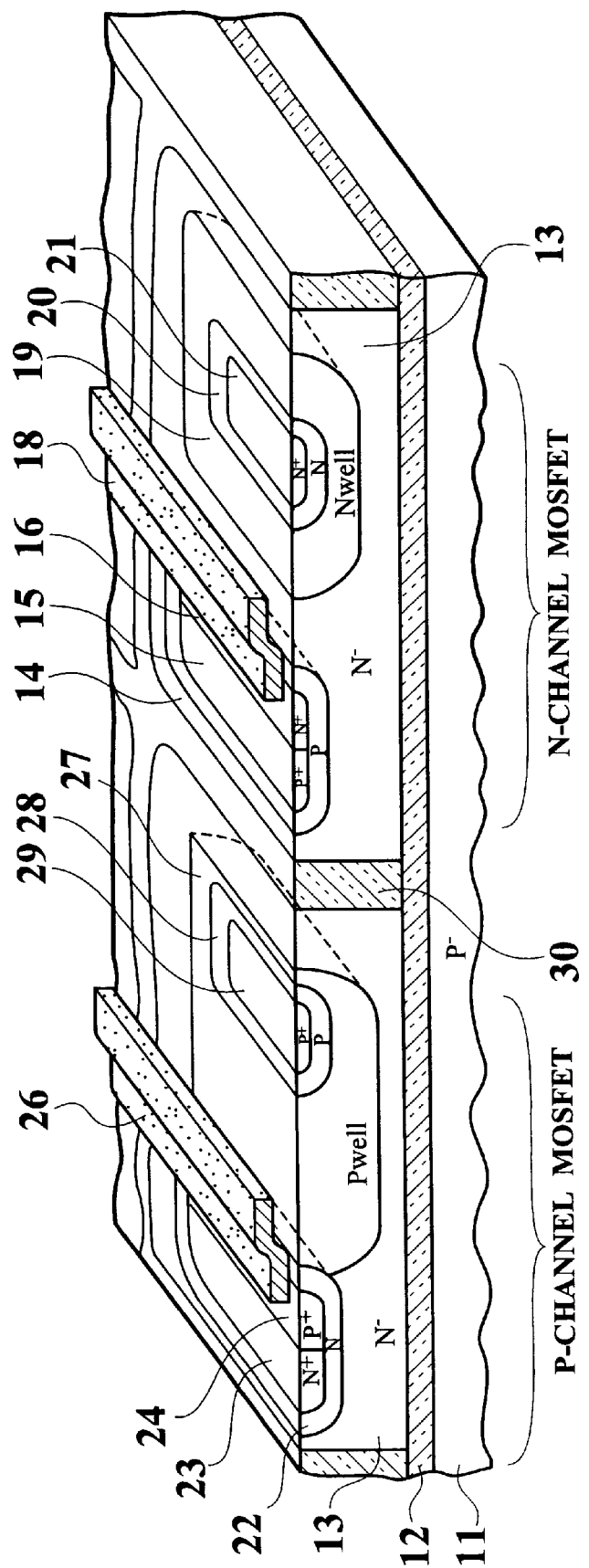
FIG. 5 is a perspective side view partly showing a semiconductor device having the n-channel MOSFET of the first embodiment and the p-channel MOSFET of the third embodiment.

FIG. 5 shows a part of a semiconductor device having the n-channel MOSFET of the first embodiment and the p-channel MOSFET of the third embodiment on the same substrate. By short-circuiting the gate electrodes of these MOSFETs and by arranging required wiring, a CMOS circuit will be formed. The MOSFETs are electrically isolated from one another by an insulator layer 12 contained in an SOI substrate and by an isolation layer 30 that surrounds each MOSFET.

When manufacturing the CMOS, the n-type impurity diffusion region 22 in each p-channel MOSFET and the n-type impurity diffusion region 20 in each n-channel MOSFET are manufacturable in the same ion implanting process and annealing process. In this way, the MOSFETs of the present invention are rationally manufacturable through simple processes.

Although the present invention has been explained with reference to the preferred embodiments, the present invention is not limited to them. Conductivity types in each element are not limited to those mentioned in the embodiments. As is apparent for those skilled in the art, the present invention may allow many modifications in element sizes, semiconductor types, doping materials, etc.

What is claimed is:

1. A semiconductor device comprising:

a semiconductor layer of a first conductivity type formed on an insulator layer;

a first impurity diffusion region of a second conductivity type formed in a surface area of the semiconductor layer;

a second impurity diffusion region of the first conductivity type formed in a surface area of the first impurity diffusion region and serving as a source region;

a gate insulating layer formed on the first impurity diffusion region and covering a region between the source region and the semiconductor layer;

a gate electrode formed on the gate insulating layer;

a third impurity diffusion region of the first conductivity type formed in a surface area of the semiconductor layer at a predetermined position away from the first impurity diffusion region; and a fourth impurity diffusion region of the first conductivity type formed in a surface area of the third impurity diffusion region and serving as a drain region, the impurity concentration of the third impurity diffusion region being lower than that of the drain region and higher than that of the semiconductor layer.

2. The semiconductor device of claim 1, wherein:

the impurity concentration of the third impurity diffusion region is low on the first impurity diffusion region side and high on the drain region side.

3. The semiconductor device of claim 1, wherein:

the impurity concentration of the third impurity diffusion region is in the range of $10^{14}$ cm$^{-3}$ to $10^{19}$ cm$^{-3}$.

4. The semiconductor device of claim 1, wherein:

the depth of the first impurity diffusion region is so set as to join a depletion layer formed around the first impurity diffusion region to a depletion layer formed around an interface of the insulator layer when the semiconductor device is reversely biased.

5. The semiconductor device of claim 1, wherein:
the first impurity diffusion region and the second impurity diffusion region are double diffused regions.

6. The semiconductor device of claim 2, wherein:
the impurity concentration of the third impurity diffusion region is in the range of $10^{14}$ cm$^{-3}$ to $10^{19}$ cm$^{-3}$.

7. The semiconductor device of claim 2, wherein:
the third impurity diffusion region has a first well of the first conductivity type having an impurity concentration higher than that of the semiconductor layer, and a second well of the first conductivity type formed in a surface area in the first well and having an impurity concentration that is higher than that of the first well and lower than that of the drain region; and
the drain region is present in a surface area in the second well.

8. The semiconductor device of claim 2, wherein:
the depth of the first impurity diffusion region is so set as to join a depletion layer formed around the first impurity diffusion region to a depletion layer formed around an interface of the insulator layer when the semiconductor device is reversely biased.

9. A semiconductor device comprising:
a semiconductor layer of a first conductivity type formed on an insulator layer;
a first impurity diffusion region of a second conductivity type formed in a surface area of the semiconductor layer;
a second impurity diffusion region of the first conductivity type formed in a surface area of the first impurity diffusion region and serving as a source region;
a third impurity diffusion region of the first conductivity type formed in a surface area of the semiconductor layer so that an edge thereof is in contact with the first impurity diffusion region;
a gate insulating layer formed on the first impurity diffusion region and covering a region between the source region and the third impurity diffusion region;
a gate electrode formed on the gate insulating layer; and
a fourth impurity diffusion region of the first conductivity type formed in a surface area of the third impurity diffusion region and serving as a drain region,
the impurity concentration of the third impurity diffusion region being lower than that of the drain region and higher than that of the semiconductor layer, and
the impurity concentration of the third impurity diffusion region being low on the first impurity diffusion region side and high on the drain region side.

10. The semiconductor device of claim 9, wherein:
the third impurity diffusion region has a first well of the first conductivity type having an impurity concentration higher than that of the semiconductor layer, and a second well of the first conductivity type formed in a surface area in the first well and having an impurity concentration that is higher than that of the first well and lower than that of the drain region; and
the drain region is present in a surface area in the second well.

11. The semiconductor device of claim 9, wherein:
the depth of the first impurity diffusion region is so set as to join a depletion layer formed around the first impurity diffusion region to a depletion layer formed around an interface of the insulator layer when the semiconductor device is reversely biased.

12. The semiconductor device of claim 9, wherein:
the first impurity diffusion region and the second impurity diffusion region are double diffused regions.

13. A semiconductor device comprising:
a semiconductor layer of a first conductivity type formed on an insulator layer;
a first impurity diffusion region of a second conductivity type formed in a surface area of the semiconductor layer;
a second impurity diffusion region of a second conductivity type formed in a surface area of the first impurity diffusion region and serving as a source region;
a third impurity diffusion region of the second conductivity type formed in a surface area of the semiconductor layer so that an edge thereof is in contact with the first impurity diffusion region;
a gate insulating layer formed on the first impurity diffusion region and covering a region between the source region and the third impurity diffusion region;
a gate electrode formed on the gate insulating layer; and
a fourth impurity diffusion region of the second conductivity type formed in a surface area of the third impurity diffusion region and serving as a drain region,
the depth of the third impurity diffusion region being smaller than the thickness of the semiconductor layer so that, when the semiconductor device is reversely biased, a depletion layer extending from under the gate electrode toward the third impurity diffusion region may join a depletion layer formed around an interface of the insulator layer.

14. The semiconductor device of claim 13, wherein:
the impurity concentration of the third impurity diffusion region is low on the first impurity diffusion region side and high on the drain region side.

15. The semiconductor device of claim 13, wherein:
the depth of the third impurity diffusion region is not smaller than about ⅓ of the thickness of the semiconductor layer.

16. The semiconductor device of claim 13, wherein:
the first impurity diffusion region and the second impurity diffusion region are double diffused regions.

17. The semiconductor device of claim 15, wherein:
the impurity concentration of the third impurity diffusion region is low on the first impurity diffusion region side and high on the drain region side.

18. A semiconductor device comprising:
a semiconductor layer of a first conductivity type formed on an insulator layer;
a first impurity diffusion region of the first conductivity type formed in a surface area of the semiconductor layer;
a second impurity diffusion region of a second conductivity type formed in a surface area of the first impurity diffusion region and serving as a source region;
a third impurity diffusion region of the second conductivity type formed in a surface area of the semiconductor layer so that an edge thereof is in contact with the first impurity diffusion region;
a gate insulating layer formed on the first impurity diffusion region and covering a region between the source region and the third impurity diffusion region;

a gate electrode formed on the gate insulating layer; and a fourth impurity diffusion region of the second conductivity type formed in a surface area of the third impurity diffusion region and serving as a drain region, the depth of the third impurity diffusion region being in the range of about ⅓ to ⅔ of the thickness of the semiconductor layer.

19. The semiconductor device of claim 18, wherein:
the impurity concentration of the third impurity diffusion region is low on the first impurity diffusion region side and high on the drain region side.

20. The semiconductor device of claim 18, wherein:
the first impurity diffusion region and the second impurity diffusion region are double diffused regions.

* * * * *